United States Patent
Takashima et al.

(10) Patent No.: US 6,779,975 B2
(45) Date of Patent: Aug. 24, 2004

(54) DUCT FAN UNIT

(75) Inventors: Osamu Takashima, Tokyo (JP);
Kazuyoshi Matsumoto, Tokyo (JP);
Junichi Murano, Sayama (JP);
Katsunori Shoji, Chigasaki (JP);
Kiyoshi Tsukamura, Atsugi (JP);
Toshiyuki Uchida, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/244,466

(22) Filed: Sep. 17, 2002

(65) Prior Publication Data

US 2003/0053908 A1 Mar. 20, 2003

(30) Foreign Application Priority Data

Sep. 18, 2001 (JP) ........................................ 2001-284160

(51) Int. Cl.[7] .............................................. F04D 29/64
(52) U.S. Cl. ................................ 415/213.1; 415/214.1; 415/220
(58) Field of Search ............................ 415/213.1, 214.1, 415/220, 175; 361/695

(56) References Cited

U.S. PATENT DOCUMENTS

| 4,803,593 | A |   | 2/1989  | Matsumoto et al. |
|-----------|---|---|---------|------------------|
| 5,594,539 | A |   | 1/1997  | Murano et al.    |
| 5,799,229 | A |   | 8/1998  | Yokoyama et al.  |
| 5,878,317 | A |   | 3/1999  | Masuda et al.    |
| 5,913,095 | A |   | 6/1999  | Takashima et al. |
| 5,936,836 | A | * | 8/1999  | Scholder ...................... 361/695 |
| 5,946,529 | A |   | 8/1999  | Sato et al.      |
| 6,215,659 | B1|   | 4/2001  | Chen             |
| 6,343,011 | B1| * | 1/2002  | Yu ............................. 361/695 |
| 6,400,568 | B1| * | 6/2002  | Kim et al. .................. 361/697 |
| 6,501,917 | B1|   | 12/2002 | Karasawa         |

FOREIGN PATENT DOCUMENTS

| DE | 20014274 U1 | 11/2000 |
| JP | 07092862    | 4/1995  |
| JP | 2000022375  | 1/2000  |

* cited by examiner

*Primary Examiner*—Ninh H. Nguyen
(74) *Attorney, Agent, or Firm*—Oblon, Spivak, McClelland, Maier & Neustadt, P.C.

(57) ABSTRACT

A duct fan unit, which is a simple structure that can be disassembled by an easy operation and the manufacture cost thereof can be decreased. The duct fan unit comprises a duct and a fan. The duct, allows air to pass through is constructed by engaging two duct constructing members together. The fan is installed inside the duct. A guide portion having a rib shape is set on only one of the duct constructing members such that the fan can be installed easily. A resilient protrusion is set on the other duct constructing member such that the fan can be resiliently pressed for securing the fan in position. Therefore, by simply latching the connecting plate of one duct constructing member with the connecting hole of the other duct constructing member the two duct constructing members are fixed to each other.

6 Claims, 4 Drawing Sheets

DUCT FAN UNIT

CROSS-REFERENCE TO RELATED APPLICATION

This application claims the priority benefit of Japanese application serial no. 2001-284160, filed on Sep. 18, 2001 and 2002-234545, filed on Aug. 12, 2002.

BACKGROUND OF THE INVENTION

1. Field of the Invention

This invention relates to a duct fan unit which is used for ventilating as a cooling device in various machines wherein a case thereof receives heat generation members such as a motor, a coil and a heater etc.

2. Description of the Related Art

In order to prevent temperature buildup inside a case due to continuous heat generation from the heat generation members that are disposed inside the case, such as a motor, a coil, a heater and a heat generation circuit etc., in an image forming apparatus, a communication equipment, other electrical equipment or various mechanism, a fan is used. The fan ventilates the heat generation member by removing the air inside the case to the outside. Thus the heat generated around the heat generation members can be radiated to outside.

It is well known that a fan and a duct are assembled to form a duct fan unit to achieve the function described above. FIG. 2 is a perspective view showing disassembling of a conventional duct fan unit. The duct 1 is generally made of resin. The duct 1 is disposed at a predetermined location inside a case containing a heat generation unit. The duct 1 is designed into a shape suitable for influx and exhaust of air. A fan 5 is embedded and fixed onto the inner wall of an opening 1a at one end of the duct 1. The other end 1b of the duct 1 is attached to a vent hole set on a case (not shown). The fan 5 comprises a motor (not shown) disposed inside the outer frame 6 and blades 7 driven by the motor to rotate. In this example, the fan 5 is fixed onto the duct 1 as described below. Screw receivers 2 are for example are set on four corners of the duct 1, and through holes 6a corresponding to these screw receivers 2 are set on the outer frame 6 of the fan 5. Long screws 8 are driven through the through holes 6a and into the screw receivers 2 in order to fix the fan 5 onto the duct 1.

However, in the conventional duct fan unit, because the screws 8 are used to fix the fan 5 inside the duct 1, not only the assembly operation but also the disassembling operation is complicated. Thus both assembly and disassembly operations becomes very inconvenient and therefore cannot be effective.

The Japanese Laid-Open publication no. 2000-22375 discloses a structure in which the fan unit can be easily replaced when the fan unit is out of order. The structure is shown as FIGS. 3A and 3B, a resilient plate 42 and an engaging plate 43 are used to fix the fan unit 41 onto the fixing portion 44. The resilient plate 42 is in contact with one side of the fan unit 41 and the resilient plate 42 presses the fan unit 41 to one side. The engaging plate 43 disposed opposite to the resilient plate 42 is latched to the fan unit 41 and the engaging plate 43 fixes the fan unit 41 at a predetermined position. Structure members for limiting the positions of the resilient plate 42 or the engaging plate 43 and the fan unit 41, such as limiting portions 45, 46 etc. are integrally formed with the duct frame 40 that receives a heat generation unit. Furthermore, the resilient plate 42 and the engaging plate 43 are perpendicular to the flow passage of the cooling air of the fan unit 41.

In spite of the simplified assembly and disassembly operations facilitated by the structure disclosed in the Japanese Laid-Open publication no. 2000-22375, however, it can be understood from the drawings that the structure is very complicated. Therefore, the manufacture cost becomes high.

Another Japanese Laid-Open publication no. He7-92862 as shown in FIG. 4, discloses a structure comprising a duct which is assembled by a pair of duct constructing members 51, 52 for ventilating air and a fan 53 that is clamped and supported within the duct by the pair of duct constructing members 51, 52. The plane of engagement of the pair of duct constructing members 51, 52 of the duct is substantially along the air flow direction. When assembling, the fan 53 is positioned and clamped by using guide ribs 56, 57 that are formed as an individual pair of ribs on the inner wall of the duct constructing members 51, 52, so that a duct is formed, then the duct constructing members 51, 52 are secured by the fastening screws. A duct case 55 where an ozone filter 54 is inserted to an end of the duct is fixed by screws. Each guide rib 56, 57 is constructed by a pair of rib portions protruding perpendicular with respect to air flow direction.

In spite of the disassembly operation of the fan 53 from the duct facilitated by the structure disclosed in the Japanese Laid-Open publication no. He7-92862, the problem resulting from using the pair of guide ribs 56, 57 to fix the fan 53 to a fixed position the fan 53 inside the duct occurs. When assembling, if the direction of the guide ribs 56, 57 are not perpendicular to the air flow direction, the fan 53 cannot be clamped under the desired condition. Further, the duct constructing members 51, 52 cannot be correctly assembled to construct the duct. Therefore, the formation of the duct constructing members 51, 52 which are generally made of resin is required to be constructed under a precision conditions and thus the cost thereof is high. Furthermore, when the position of the guide ribs 56, 57 gets slightly changed, attempts to assemble the fan 53 and the duct constructing members 51, 52 by force may break the duct constructing members 51, 52.

SUMMARY OF THE INVENTION

One object of the present invention is to provide a duct fan unit wherein the fan is installed inside a duct without those inconveniences described above. The structure of the duct fan unit is simpler and the operation of detaching the fan is easy and the manufacture cost can be decreased.

For solving the problems described above, another object of the present invention is to provide a duct fan unit wherein the fan is installed inside a duct to solve the inconvenience of detaching the fan as experienced by fixing the fan to the conventional duct using screws.

In accordance with the above objects and other advantages of the present invention, a structure of a duct fan unit is provided. The duct fan unit comprises a duct, at least a fan, at least a guide portion and at least a protrusion portion. The duct is divided into a pair of duct constructing members to allow air to pass through. The fan is clamped by the pair of duct constructing members and supported inside the duct, wherein a division direction of the duct is substantially along an air flow direction created by the fan. The guide portion is disposed at an inner wall of one of the duct constructing members to limit an installation position of the fan inside the duct. The guide portion extends from the inner wall of the duct member in a shape of a rib perpendicular to the division direction. The protrusion portion is disposed at an inner wall of the other duct constructing member to make contact with an outer wall of the fan and to resiliently press the fan towards a side of the duct constructing member. The protrusion portion protrudes towards a direction perpendicular to the division direction.

According to an aspect of the present invention, at a side wall where the protrusion portion is formed, a portion surrounding the protrusion portion is notched to form at least a pair of openings facing to each other.

According to another aspect of the present invention, the pair of openings is a pair of slots.

According to another aspect of the present invention, the duct fan unit comprises a duct and a fan. The duct allows air to pass through and the duct is divided into two duct constructing members along an axial direction of the duct. The fan is embedded on an inner wall of the duct. The fan is clamped by the two duct constructing members and an outer wall of the fan is pressed inward and supported by the inner wall of the duct According to another aspect of the present invention, the duct constructing members comprise a connecting portion respectively formed on the ends of the duct constructing members with the connection portion of one duct constructing member facing the connecting portion of the other duct constructing member, and the two duct constructing members are detachably latched to each other through the connecting portion. The connecting portion comprise a connecting claw set at one of the duct constructing member and a receiving portion set at the other duct constructing member for receiving the connecting claw.

According to another aspect of the present invention, at least one duct constructing member further comprises a resilient portion disposed at an inner wall of the duct constructing member and the resilient portion is in contact with an outer wall of the fan, and the fan is resiliently pressed inward by the resilient portion.

Additionally, the fan mentioned in the present invention is not restricted to only the fan itself but other things assembled with fan, for example like the filter etc. disclosed in the Japanese Laid-Open publication no. 7-92862 are also involved.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

FIGS. 3A and 3B show a conventional duct fan unit as another example, wherein FIG. 3A is a front view and FIG. 3B is cross-sectional view.

DESCRIPTION OF THE PREFERRED EMBODIMENT

The embodiment of the duct fan unit according to the present invention is explained in conjunction with the drawings as follows. Though one fan is explained as an example, the present invention is not limited to one fan. Though the constructing members are generally made of resin, the present invention is not limited to so, the constructing members made of metal can also be used to practice the present invention.

Figure 1B:
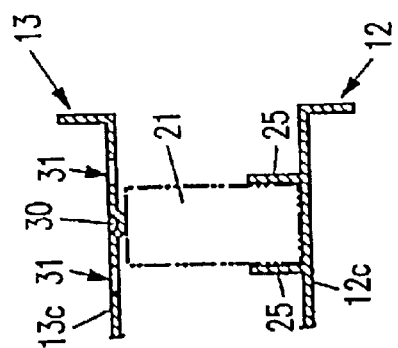
FIG. 1B is a cross-sectional view taken along the B—B of FIG. 1A.
Figure 1A:
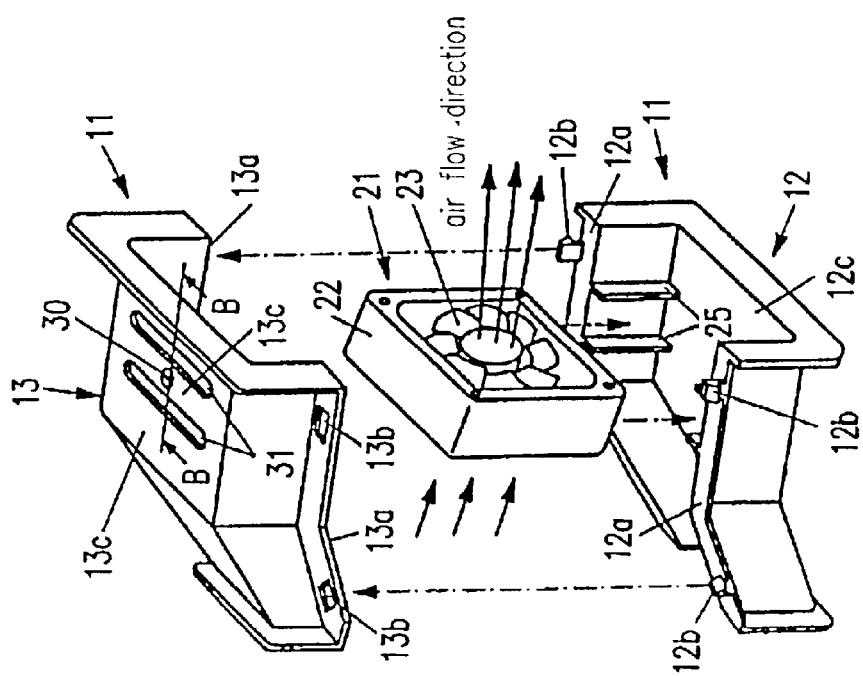
FIG. 1A is a perspective view showing the disassembly of the duct fan unit according to one embodiment of the present invention.
Figure 2:
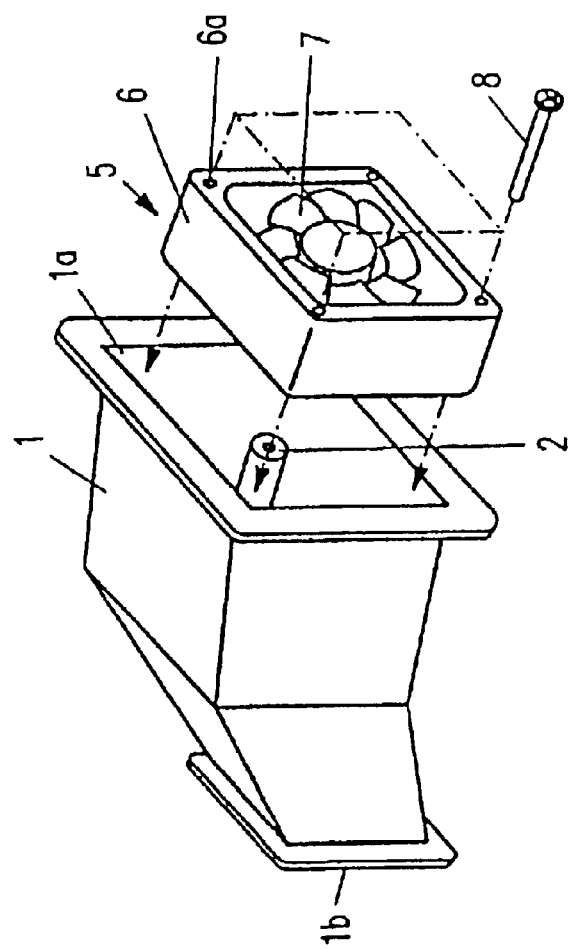
FIG. 2 is a perspective view showing a disassembly of a conventional duct fan unit.
Figures 3A, 3B:
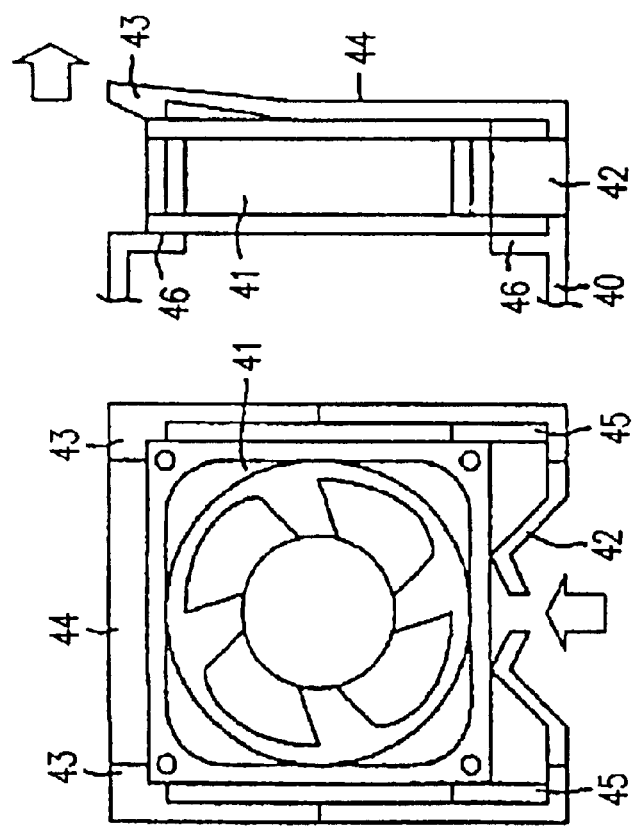
Figure 4:
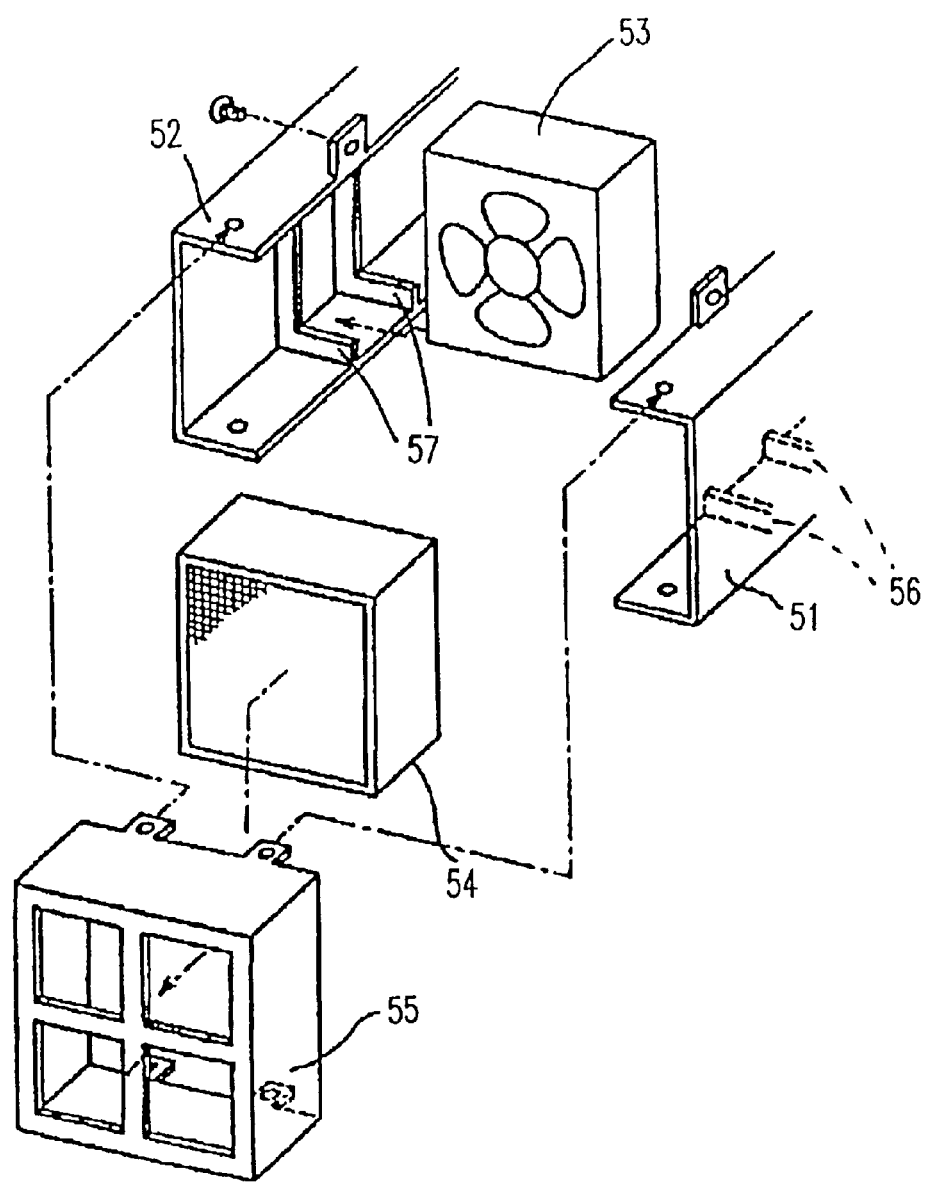
FIG. 4 is a perspective view showing a disassembly of another conventional duct fan unit.

FIG. 1A is an exploded view of a duct fan unit according to one embodiment of the present invention FIG. 1B is a cross-sectional view taking along a line B—B in FIG. 1A. The duct fan unit comprises a duct 11 and a fan 21. The duct 11 is a shell through which air passes. The fan 21 is embedded inside one end of the duct 11. A pair of duct constructing members 12, 13 surrounds and clamps the outer wall of the fan 21. The outer wall of the fan 21 is pressed and supported by the inner wall of the duct.

The fan 21 comprises an outer frame 22 and blades 23, wherein a motor (not shown) is disposed inside the outer frame 22. The outer frame 22 is formed in a shape suitable to be embedded in the inner wall of the duct 11. The blades 23 are driven by the motor to rotate. Various fans other than the fan shown in the drawing can also be used in the present invention.

The pair of duct constructing members 12, 13 that constructs the duct 11 are detachably engaged to form the duct 11, wherein a plane of engagement of the duct constructing members 12, 13 is along an axial direction of the duct 11, that is, along the direction of the air flow inside the duct 11 due to the fan 21. A connecting plate 12b and a connecting hole 13b that receives the connecting plate 12b and serves as a receiving portion are respectively formed on each latching end (opposite end) 12a, 13a of the duct constructing members 12, 13. Alternatively, the hole can be set on the duct constructing member 12 and the protrusion can be set on the duct constructing member 13.

The duct constructing member 12 is detachably latched to the duct constructing member 13. The latching portion comprises a connecting claw 12b which constitutes a connecting plate of the duct constructing member 12 and a connecting hole 13b which constitutes a receiving portion of the duct constructing member 13. The receiving portion 13b can be a hole as shown in the drawing or a protrusion. By inserting the claw 12b of the connecting portion 12a of the duct constructing member 12 into the connecting hole 13b of the connecting portion 13a of the duct connecting member 13, the duct constructing members can be detachably latched to each other. Latch structures other than the latch structure shown in the present invention, such as the latch structure latched with ribs by using the latching ends 12a, 13a, can also be used.

In this way, because the duct fan unit comprises a snap fitting structure constructed by the connecting claw 12b and the receiving portion 13b which is detachably latched to the connecting claw 12b, the assembly and disassembly operation thereof is relatively easier compared to the structure which is assembled and disassembled using screws. The fan after assembling can be sufficiently supported in the structure of the present invention.

A pair of ribs 25 is respectively set on opposite sides of the inner wall of only one of the duct constructing members 12, 13, specifically the pair of ribs 25 is set on only the duct constructing member 12 which is disposed at a lower side when assembling and installing. These ribs 25 protrude in a so-called rib shape extending from an inner wall perpendicular to the division direction of the duct 11 along the height direction and the width direction (except along the thickness direction). The fan 21 is clamped and can slide in between the ribs 25. Therefore, the installation of the fan into the duct can be well insured. Alternatively the ribs 25 can be set on the bottom inner wall 12*c* of the duct constructing member 12.

On the other hand, in the side walls of the duct constructing member 13, a resilient protrusion 30 is formed at the top surface 13*c* that is parallel to the plane of engagement of the duct constructing members 12, 13. During the assembly operation, the duct constructing member 13 is positioned at the lower side. The outer top face of the outer frame 22 of the fan 21 is pressed and in contact with the resilient protrusion 30. The resilient protrusion 30 resiliently presses against the fan 21 towards the bottom face 12*c* of the other duct constructing member 12. The resilient protrusion 30 is set to correspond the installation position of the fan 21 on the duct constructing member 12 at a height corresponding to the height of the fan 21.

In this example, the resilient protrusion 30 is a protrusion comprising a half-ball shape and is set at the top surface 13*c* of the duct constructing member 13 with round shape protruding from the inner wall of the duct 11. Punch holes 31 with slot shapes are set in the air flow direction both in front and behind of the resilient protrusion 30. The portion where the resilient protrusion 30 is set is rendered with high resilience and flexibility due to the punch holes 31 such that the portion can easily elastically deform towards inside or outside of the duct 11. The punch holes 31 are not limited to straight slot shapes as shown in the drawing. Alternatively, the punch holes 31 can have curved shapes surrounding the resilient protrusion 30.

In the assembly of the duct 11 as shown in FIG. 1A, the duct constructing member 12 is arranged in a way that the bottom face 12*c* is disposed at the lower side to make the duct 11 open on the upper side. The fan 21 is slid clamped in between the ribs 25 to rest on the lower side. The duct constructing member 13 is hung from the upper side and the duct constructing member 12 is aligned with the duct constructing member 13 such that the latching ends 12*a*, 13*a* of the two duct constructing members 12, 13 fit with each other. The connecting plates 12*b* of the duct constructing member 12 is latched into the connecting holes 13*b* of the duct constructing member 13 in a way called snap fitting.

In doing so, the resilient protrusion 30 of the duct constructing member 13 comes in contact with the outer top surface of the outer frame 22 of the fan 21. The fan 21 resiliently presses against the bottom surface 12*c* of the duct constructing member 12. Thus the assembly can be easily completed. Under this condition, because the resilient protrusion 30 is disposed inside the frame of the image forming apparatus, the outer frame 22 of the fan 21 can be resiliently restricted to a certain position, thus the vibration noise of the fan 21 during operation can be absorbed and mitigated.

It is understood from the above description that in the present invention the duct constructing members 12, 13 can be latched with each other through only the connecting plates 12*b* and the connecting holes 13*b* independent of misalignment fitting etc. The position and height of the resilient protrusion 30 are favorably set in a way that the resilient protrusion 30 can be in contact with the outer face of the fan 21 when assembling to firmly fix the fan in position. The position and height of the resilient protrusion 30 are not necessary to be set and formed with high precision. Further, when forming the duct constructing members 12, 13 using resin, the mold shape and size does not require a high precision. The formation of the duct constructing members 12, 13 does not require high precision. No matter how much the formation inaccuracy of the assembly parts is, the assembly parts are usable. It is the same case with the duct constructing members 12, 13 constructed from a metal.

On the other hand, when disassembling the duct 11, a hand tool such as a screw driver etc. may be used to detach the connecting plate 12*b* of the duct constructing member 12 out of the connecting hole 13*b* of the duct constructing member 13. Then the duct constructing member 13 is lifted and taken off. Then the fan 21 is lifted by sliding it out between the ribs 25 and taken off. Thus the disassembly is easily completed.

The duct fan unit of the present invention is suitably used in machine, mechanism using a duct fan to cool or to ventilate.

With the structure of the present invention described above, with regard to the duct fan unit, the fan is installed inside the duct, and the duct is divided into two duct constructing members dividing the duct along a axial direction of the duct. Each duct constructing member is detachably engaged to each other by the connecting portion. Because the fan is clamped between the duct constructing members in a way that the outer wall of the fan is supported, therefore the inconvenience of disassembly due to fixing of the fan onto the duct using screws can be resolved.

Furthermore, because the claw is used as the connecting plate, therefore the unit can be assembled and disassembled easily.

The duct fan unit according to the present invention is according to the structure described above. The guide unit with a rib shape is used for securing the fan onto one of the duct constructing members. Therefore, the fan can be clamped inside the duct and the fan can be pressed within the duct by only hanging one of the duct constructing member and pressing the other duct constructing member against the duct constructing member for clamping the fan and the protrusion resiliently pressing against the fan. Thus the duct fan unit can be assembled and disassembled easily.

Furthermore, because the protrusion which is in contact with the outer wall of the fan and maintains pressure, therefore the outer wall of the fan is secured within the inner walls of the duct, thus the fan can firmly fixed inside the duct and the noise due to vibration can be substantially reduced.

Additionally, the opening is formed to further improve the resilient pressing effects of the protrusion.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A duct fan unit, comprising:
   a duct, to allow air to pass through, constructed from an engagement of a pair of duct constructing members;
   at least a fan, clamped and supported inside the duct by the pair of duct constructing members, wherein a plane of engagement of the pair of duct constructing members of the duct is substantially along an air flow direction created by the fan;
   at least a guide portion, disposed on an inner wall of one of the duct constructing members to limit an installation position of the fan, wherein the guide portion is a rib shape extending from the inner wall perpendicular to the plane of engagement of the pair of duct constructing members; and at least a protrusion portion, disposed on an inner wall of the other duct constructing member to make contact with an outer wall of the fan and resiliently press against the fan towards a side of the duct constructing member, wherein the protrusion portion protrudes in a direction perpendicular to the plane of engagement of the pair of duct constructing members.

2. The duct fan unit of claim 1, wherein on a side wall where the protrusion portion is formed, a portion surrounding the protrusion portion is notched to form at least a pair of openings facing to each other.

3. The duct fan unit of claim 2, wherein the pair of openings is a pair of slots.

4. A duct fan unit, comprising:

a duct, allowing air to pass through and the duct is constructed from an engagement of two duct constructing members, wherein a plane of engagement of the two duct constructing members is along an axial direction of the duct; and a fan, embedded to fix on an inner wall of the duct, wherein the fan is clamped by the two duct constructing members and an outer wall of the fan is pressed inward and supported by the inner wall of the duct.

5. The duct fan unit of claim 4, wherein the duct constructing members comprise a connecting portion on an edge of the duct constructing members, the connecting portion of one duct constructing member facing the connecting portion of the other duct constructing member, and the two duct constructing members are detachably latched to each other through the connecting portion, and wherein the connecting portion of one of the duct constructing member comprises a connecting claw and the connecting portion of the other duct constructing member comprises a receiving portion for receiving the connecting claw.

6. The duct fan unit of claim 4, wherein at least one of the duct constructing members further comprises a resilient portion disposed on an inner wall of the duct constructing member and the resilient portion is in contact with an outer wall of the fan, and the fan is resiliently pressed inward by the resilient portion.

* * * * *

UNITED STATES PATENT AND TRADEMARK OFFICE
CERTIFICATE OF CORRECTION

PATENT NO. : 6,779,975 B2
DATED : August 24, 2004
INVENTOR(S) : Takashima et al.

It is certified that error appears in the above-identified patent and that said Letters Patent is hereby corrected as shown below:

<u>Title page,</u>
Item [30], Foreign Application Priority Data, should read:
-- [30]     Foreign Application Priority Data
    Sep. 18, 2001  (JP) ........................... 2001-284160
    Aug. 12, 2002  (JP) ...........................2002-234545 --

Signed and Sealed this

Thirtieth Day of November, 2004

JON W. DUDAS
*Director of the United States Patent and Trademark Office*